United States Patent [19]

Hirano et al.

[11] 4,298,846
[45] Nov. 3, 1981

[54] SEMICONDUCTOR DEVICE

[75] Inventors: Yutaka Hirano, Atsugi; Nobutoshi Fukuden, Yokohama; Toshiaki Saito, Kawasaki, all of Japan

[73] Assignee: Fujitsu Limited, Kawasaki, Japan

[21] Appl. No.: 128,655

[22] Filed: Mar. 10, 1980

[30] Foreign Application Priority Data

Mar. 10, 1979 [JP] Japan ................... 54-30994

[51] Int. Cl.³ .............................................. H03H 7/38
[52] U.S. Cl. .................................. 333/32; 29/577 C; 357/51; 357/81
[58] Field of Search .................. 333/32, 33, 247; 357/81, 51; 29/576 S, 577 R, 577 C

[56] References Cited

U.S. PATENT DOCUMENTS

| 3,825,805 | 7/1974 | Belohoubeck et al. | 333/247 X |
| 3,838,443 | 9/1974 | Laighton | 357/81 X |
| 4,107,728 | 8/1978 | Max | 333/247 X |
| 4,135,168 | 1/1979 | Wade | 357/81 X |

Primary Examiner—Paul L. Gensler
Attorney, Agent, or Firm—Staas & Halsey

[57] ABSTRACT

A high-power and high-frequency semiconductor device assembled on a base, comprising a semiconductor chip, capacitors for grounding high-frequency components, and capacitors for input impedance matching, the capacitors being arranged on a metal surface of the base.

36 Claims, 13 Drawing Figures

SEMICONDUCTOR DEVICE

BACKGROUND OF THE INVENTION

This invention relates to a semiconductor device, and more particularly to a high-power and high-frequency device of self-biased type.

Microwave-semiconductor devices succh as Gallium Arsenide Schottky barrier field-effect transistors (GaAs FET), are well known from prior art (cf. Kazuhiko Honjo et al., "Broad-Band Internal Matching of Microwave Power GaAs MESFET's", IEEE Transactions on Microwave Theory and Techniques, Vol. MTT-27, No. 1, January 1979, pp.-3 through 8, and Masumi Fukuta et al., "GaAs Microwave Power FET", IEEE Transactions on Electron Devices, Vol. ED-23, No. 4, April 1976, pp-388 through 394). Such a device includes one or more semiconductor chips. In order to improve the high-frequency characteristics of such a device, it is essential to have a small grounding inductance. For decreasing inductance, these semiconductor chips are assembled on a base made of, for example, copper with a film of gold plating, so as to shorten the length of the wire connected between the source electrode of one chip and the ground.

Figure 1:
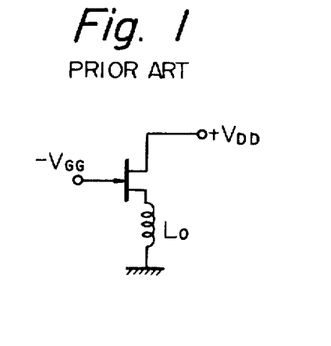
FIG. 1 is a prior-art circuit diagram illustrating a generally known GaAs FET device assembled in a package.

FIG. 1 is a circuit diagram illustrating a generally known FET assembled on a metal base. As shown illustrated in FIG. 1, the source electrode of this FET chip is connected to the ground through a wire having an inductance $L_0$. Various steps have been successfully taken to reduce the inductance of the wire connected between the source electrode and the ground (see the above-mentioned references). In the circuit of this generally known type, the length of the wire can be made short because the distance between the source electrode and the ground is very short.

However, since the gate bias voltage must be lower than the source voltage, and the source voltage is zero volts because the source electrode is connected to ground through a conductive wire, such as a gold wire, a negative bias voltage $-V_{GG}$ is applied to the gate electrode of the FET chip of FIG. 1. Therefore, the circuit of FIG. 1 requires two power supplies, i.e., $+V_{DD}$ and $-V_{GG}$.

In addition, when a drain voltage is applied to the drain without applying a gate bias voltage, the drain current will flow up to its maximum value, resulting in a higher channel temperature than the maximum safe channel temperature of the device. At such a high channel temperature the FET chip will be destroyed. To avoid destruction of the FET chip, it is necessary to apply a gate bias voltage before applying a drain voltage. This procedure of biasing is very troublesome.

Figure 2:
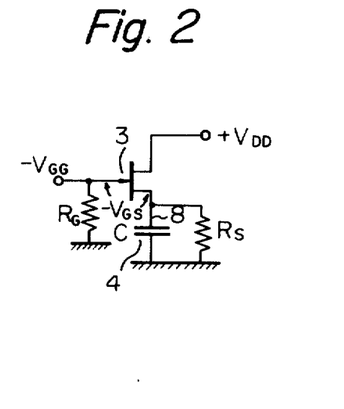
FIG. 2 is a circuit diagram of a self-biased GaAs FET device assembled in a package.

In order to simplify the procedure of biasing and to reduce the number of power supplies, a known circuit of a self-biased FET, also assembled on a metal base, was proposed and is illustrated in FIG. 2. As illustrated in FIG. 2, a capacitor C and a resistor $R_S$ are connected in parallel between the source electrode of the FET chip and the metal base. A resistor $R_G$ is connected between the gate electrode of the FET chip and the ground. These resistors are connected outside the metal base. By this construction, high-frequency components of the current flowing through the source electrode are grounded through the capacitor C and DC components of the current pass through the resistor $R_S$, resulting in the desired plus voltage at the source electrode of the FET chip. The direct current, conducted through the resistor $R_S$, gives an appropriate bias voltage to the gate electrode of the FET chip. In the circuit of FIG. 2, only one power supply $+V_{DD}$ is required.

Figure 3:
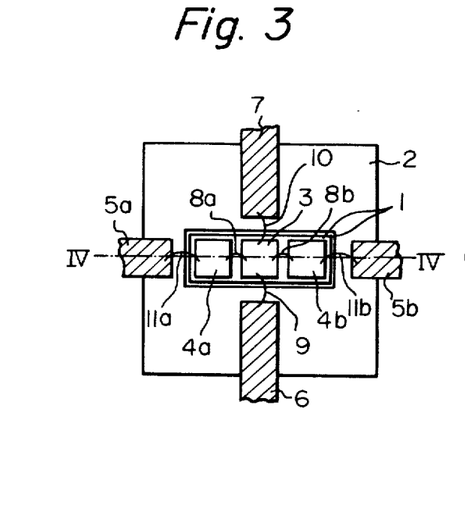
FIG. 3 illustrates a plan view of the self-biased GaAs FET device of FIG. 2.
Figure 4:
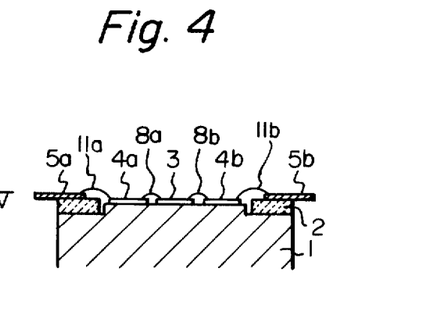
FIG. 4 illustrates a cross sectional view taken along the line IV—IV of FIG. 3.

FIG. 3 illustrates a plan view of the circuit device of FIG. 2. A cross sectional view taken along the line IV—IV of FIG. 3 is illustrated in FIG. 4. Referring to FIGS. 3 and 4, the FET chip 3 and two capacitors 4a and 4b are mounted on a surface of a metal base 1 which forms the ground electrode. The metal base 1 is made of, for example, copper, and serves to ground high-frequency components through the two capacitors 4a and 4b, as well as to function as a heat sink. These capacitors 4a and 4b are both made of a dielectric, both sides of which are plated with metal. The sum of the capacities of the capacitors 4a and 4b is equal to the capacitance of the capacitor 4 in FIG. 2. The periphery of the surface of the metal base 1 is covered with a ceramic portion 2 which serves as an insulator. Two source leads 5a and 5b, an output lead 6, and an input lead 7 are arranged on the ceramic portion 2. These leads 5a, 5b, 6, and 7 are terminals for connecting this device assembled on this base to external devices or elements. The source electrode of the FET chip 3 is connected to the metal surfaces of the capacitors 4a and 4b through gold wires 8a and 8b respectively. The drain electrode of the FET chip 3 is connected to the output lead 6 through a gold wire 9. The gate electrode of the FET chip 3 is connected to the input lead 7 through a gold wire 10. The metal surfaces of the capacitors 4a and 4b are connected to the source leads 5a and 5b through gold wires 11a and 11b respectively. These gold wires 8a, 8b, 9, 10, 11a, and 11b may alternatively be gold ribbons. The resistors $R_S$ and $R_G$ in FIG. 2 are not shown in FIGS. 3 and 4 because they are connected outside the metal base.

The inductance which mainly affects the high-frequency characteeristics of the circuit device of FIG. 2 is that of the wire 8 (FIG. 2) between the source electrode of the FET chip 3 and the capacitor 4. This inductance is represented in FIGS. 3 and 4 by the gold wires 8a and 8b. As illustrated in FIGS. 3 and 4, since the capacitors 4a and 4b are arranged very close to the sides of the FET chip 3, the gold wires 8a and 8b can be very short, and thus, the grounding inductance is very small. Therefore, the self-biased GaAsFET device, as illustrated in FIGS. 2 through 4, has good high-frequency characteristics.

However, the above-mentioned FET device illustrated in FIGS. 2 through 4 can be used only for low power output devices. This is because, in order to limit the length of the wires 8a and 8b, the distance between the active area on the central portion of the FET chip 3 and a surface point of the capacitor 4a or 4b must be very short. If a high-power FET chip having an interdigitated-electrode structure (cf. above-mentioned reference "GaAs Microwave Power FET", by Fukuta et al.) is used in the arrangement of FIG. 3, the length of the wires 8a and 8b will be increased because the size of the high-power FET chip is greater than that of a low-power FET chip, so that the distance between the active area of the high-power FET chip and a surface point of the capacitor 4a or 4b will be increased. Therefore, the high-poweer FET device in the arrangement of FIG. 3 has a large grounding inductance, deteriorated high-frequency characteristics and low gain.

Figure 5:
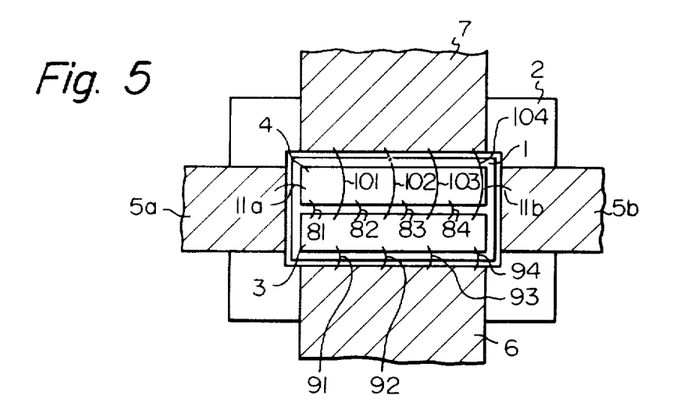
FIG. 5 illustrates an alternate structure of the device of FIG. 3 for illustrating the investigation made by the inventors.

The inventors of the present application have investigated the possibility to improve device of FIG. 3 by providing a device as illustrated in FIG. 5, which is a plan-view of the high-power FET device. As illustrated in FIG. 5, a high-power FET chip 3 has a rectangular configuration due to its interdigitated-electrode structure. To avoid complexity, the interdigitated structure is not shown in FIG. 5. A capacitor 4 for conducting high-frequency components also has the same configuration as the FET chip 3. The FET chip 3 and the capacitor 4 are both mounted in parallel on the surface of a metal base 1 in such a way that the longitudinal direction of the FET chip 3 and the capacitor 4 is perpendicular to the extending direction of an input lead 7 and an output lead 6 which are arranged on a ceramic portion 2. Further, the capacitor 4 is arranged between the input lead 7 and the FET chip 3. The ceramic portion 2 covers the peripheral portion of the surface of the base 1 as in the case of FIG. 3. The source side of the chip 3 is connected to the metal surface of the capacitor 4 through four wires 81, 82, 83, and 84 having the same length. The drain side of the chip 3 is connected to the output lead 6 through four wires 91, 92, 93, and 94 having the same length. The gate side of the chip 3 is connected to the input lead 7 through four wires 101, 102, 103, and 104 having the same length. The surface of the capacitor 4 is connected to the source leads 5a and 5b, arranged in the same way as in the case of FIG. 3, through two wires 11a and 11b.

The equivalent circuit diagram of the FET device of FIG. 5 is the same as the circuit diagram illustrated in FIG. 2.

In the above-mentioned arrangement illustrated in FIG. 5, because the wires 81, 82, 83, and 84 connected between the source electrode of the chip 3 and the capacitor 4 all have the same short length, the grounding inductance between the source electrode of the chip 3 and the capacitor 4 is small.

Figure 6:
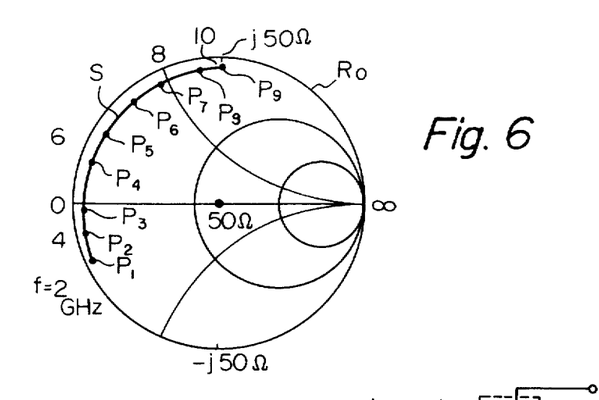
FIG. 6 is a Smith Chart illustrating a curve of an S-parameter $S_{11}$ of the GaAs FET of FIG. 5.
Figure 7:
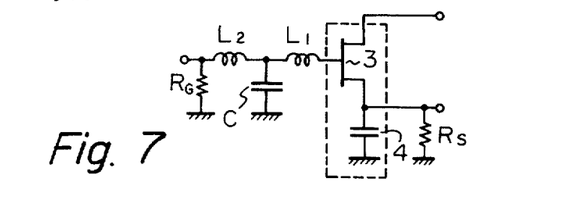
FIG. 7 is an equivalent circuit diagram showing a capacitor for input impedance matching connected to the FET device of FIG. 5.

However, the above-mentioned FET device illustrated in FIG. 5 does not make it possible to establish input-impedance matching satisfactorily. This is because the input impedance of a high-power transistor, such as the FET chip 3 in FIG. 5, is very small in comparison with the characteristic impedance of the input lead. The small input impedance is due to the large total gate width in a high power FET (such as an interdigitated FET) because, in the interdigitated structure, active FET regions connected in parallel offer a small input resistance. It is well known to represent input inpedance as an S-parameter $S_{11}$. FIG. 6 is a Smith Chart illustrating the curve of an the S-parameter $S_{11}$ of the GaAs power FET illustrated in FIG. 5. In the Smith Chart, the characteristic impedance of the input lead is 50Ω and is represented at the center of the chart. The S-parameter $S_{11}$ varies along the curve S from the point $P_1$ to the point $P_9$ when the input frequency changes from 2 GHz to 10 GHz. As will be understood from the Smith Chart, the curve S is very close to the circle Ro of the chart, where the resistive component of the impedance would be equal to zero. This means that the resistance component of the input impedance of the high-power FET is very small, and that the higher the input frequency becomes (8, 9, 10 GHz), the higher the reactive component of the input impedance becomes, and thus, the higher the Q-value of the FET becomes. It is well known that the higher the Q-value, the more difficult it is to establish wide band matching i.e., the frequency range for impedance matching is very narrow. Moreover, in order to match the input impedance to the characteristic impedance of 50Ω, it is necessary to increase the input impedance by connecting a capacitance to the input lead 7 (FIG. 5) at an appropriate point outside the base 1. FIG. 7 is an equivalent circuit diagram when the capacitor C is connected to the input lead 7 of the FET device of FIG. 5. As illustrated in FIG. 7, the FET chip 3 and the grounding capacitor 4 within the metal base 1 are inside the dotted line, and the capacitor C connected to the gate at the outside of the base 1 is outside the dotted line. Since the capacitor C for increasing the input impedance is connected outside of the base 1, the connecting lead between the gate and the capacitor C becomes long, resulting in a large inductance $L_1$. The large inductance $L_1$ causes an increase in the Q-value of the FET device. Therefore, it is very difficult to establish impedance matching, even when the capacitor C for impedance matching is inserted in the FET of FIG. 5.

Still another high-frequency semiconductor device was proposed in which a semiconductor chip and a capacitor for impedance matching are arranged in parallel between an input terminal and an output terminal of the semiconductor chip (cf. U.S. Pat. No. 4,042,952). The semiconductor chip and the capaccitor are mounted on a metal base which acts as a ground as well as a heat sink. However, in this device, because the semiconductor chip and the capacitor are insulated from the metal base, an input grounding terminal and an output grounding terminal are required, in addition to the input and output terminals. Further, a process of wire bonding to these grounding terminals is also required. Therefore the construction of the device is complex and the number of steps for manufacturing the device is increased. Moreover, this prior art does not disclose the semiconductor device of a self-biased type having a capacitor chip which includes both capacitors for input impedance matching and capacitors for grounding high-frequency components.

SUMMARY OF THE INVENTION

It is an object of the present invention to provide a semiconductor device having good high-frequency characteristics over a broad band of frequencies.

It is another object of the present invention to provide a high-frequency and high-power semiconductor device of a self-biased type including capacitors for grounding high frequency components with low grounding inductance, so as to improve the high-frequency characteristic.

It is still another object of the invention to provide a high-frequency and high-power semiconductor device of a self-biased type including capacitors for input impedance matching, the capacitors being connected by short wires with minimized inductances, whereby impedance matching can be established over a broad band of frequencies.

It is a still further object of the invention to provide a microwave power GaAs FET device of a self-biased type, including capacitors for grounding high-frequency components with low grounding inductance, so as to improve the high-frequency characteristics.

It is a still further object of the invention to provide a microwave power GaAs FET device of a self-biased type including capacitors for input impedance matching, the capacitors being connected by short wires with minimized inductances, whereby impedance matching can be established over a broad band of frequencies.

According to the present invention, there is provided a semiconductor device assembled on a base comprising: a semiconductor chip having an input electrode and an output electrode, an input lead connected to the input electrode, an output lead connected to the output electrode, and capacitors mounted between the input lead and the semiconductor chip, where these capacitors comprise of at least one capacitor for grounding high-frequency components and at least one capacitor for input-impedance matching.

DESCRIPTION OF THE PREFERRED EMBODIMENTS

The present invention will be more completely understood from the following description of the preferred embodiments with reference to FIGS. 8 through 12.

Figure 8:
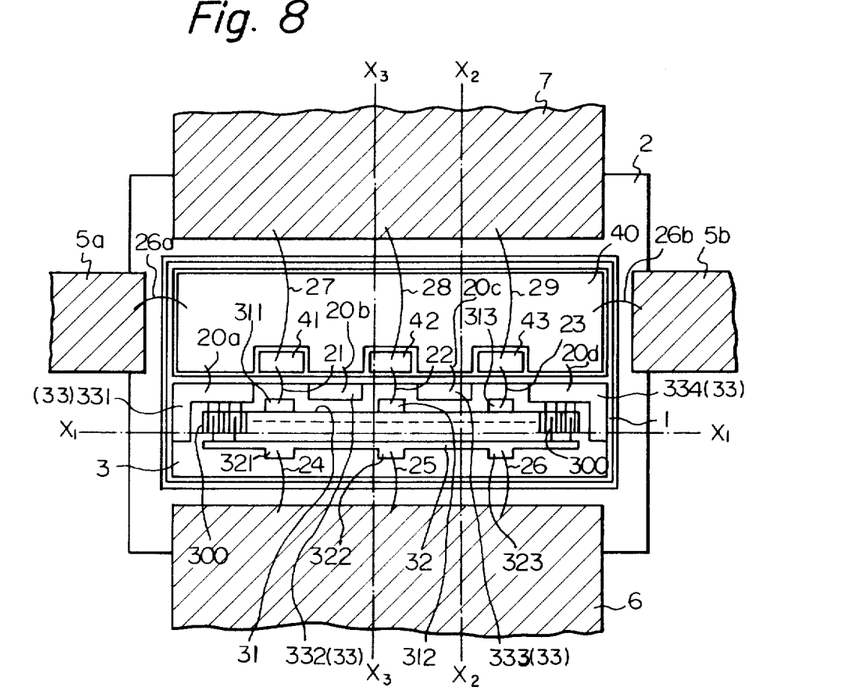
FIG. 8 illustrates a partial plan view of a high-power GaAs FET device of a self-biased type, according to an embodiment of the present invention.
Figure 9:
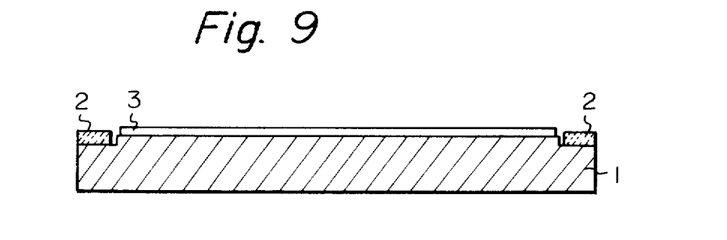
FIG. 9 illustrates a cross sectional view taken along the line $X_1$—$X_1$ of FIG. 8.
Figure 10A:
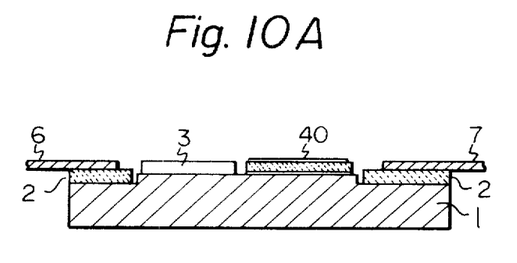
FIG. 10A and 10B illustrates a cross sectional view taken along the lines $X_2$—$X_2$ and $X_3$—$X_3$ of FIG. 8.
Figure 10B:
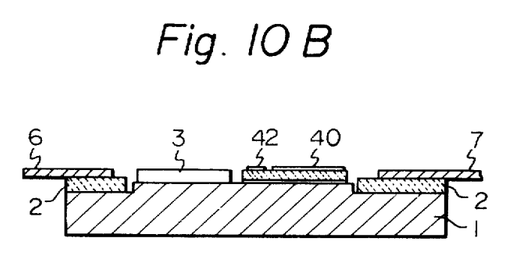

FIG. 8 illustrates a partial plan view of a high-power GaAs FET of a self-biased type according to one embodiment of the present invention. FIGS. 9, 10A and 10B are cross sectional views taken along the lines $C_1$—$X_1$, $X_2$—$x_2$, and $X_3$—$X_3$, respectively, of FIG. 8. As will be understood from FIGS. 8 through 10, the GaAs FET device of this embodiment has almost the same construction as that of the above-mentioned GaAs FET device of FIG. 5, but this FET device includes three capacitors 41, 42, and 43 for input impedance matching arranged on the metal base 1, while the FET device of FIG. 5 does not include these capacitors. These capacitors are formed by etching the metal surface of a grounding capacitor 40 in accordance with the required design for obtaining input impedance matching. Therefore, these capacitors 40, 41, 42, and 43 have on their bottoms a common metal surface to be grounded by attaching the bottom surface to the metal base 1, and on their tops, through a common dielectric material, metal surfaces separated from each other by etching. These separate surfaces are connected to the input lead 7, source leads 5a and 5b, or the electrodes of the FET chip 3 through wires in a manner as hereinafter described.

The interdigitated structure of the FET chip 3 is partially illustrated in FIG. 8. As shown in FIG. 8, the gate electrode 31, the drain electrode 32, and the source electrode 33 have many fingers 300 interdigitated to each other. This interdigitated structure is for the purpose of lowering the resistances of the gate electrodes and thus obtaining high power, and is well known from the prior art, as previously mentioned with respect to the description of the FET device of FIG. 5. The gate electrode 31 and the drain electrode 32 also have three gate bonding pads 311, 312, 313 and three drain bonding pads 321, 322, 323 respectively. Also, the source electrode 33 has four source bonding pads 331, 332, 333, and 334. These pads are suitably arranged along the longitudinal direction of the FET chip 3 so that the length of each of the wires connected between the active regions of the FET chip 3 and the capacitors 40, 41, 42, or 43, or between the active regions and the drain lead 6, is minimized. The capacitor 40 for grounding high-frequency components is connected to the source electrode 331 through a wire 20a, to the source electrode pad 332 through a wire 20b, to the source electrode pad 333 through a wire 20c and to the source electrode pad 334 through a wire 20d. The capacitor 41 for input impedance matching is connected to the gate bonding pad 311 through a wire 21. The capacitors 42 and 43 are connected to the gate bonding pads 312 and 313 through wires 22 and 23, respectively. The drain bonding pads 321, 322, and 323 are connected to three bonding points on the output lead 6 through wires 24, 25, and 26, respectively. The capacitor 40 is also connected to the source leads 5a and 5b through two wires 26a and 26b. The capacitors 41, 42, and 43 are connected to three bonding points on the input lead 7 through wires 27, 28, and 29 respectively.

As can be seen from FIGS. 9 and 10, the FET chip 3, the capacitor 40, and the capacitor 42 are mounted on the surface of the metal base 1. The metal base 1 is to be grounded and is made of, for example, Au film plated on the Cu base. The other capacitors 41 and 43 (FIG. $\smile$) are not shown in FIGS. 9 and 10, but it will easily be understood that these capacitors are also mounted on the surface of the metal base 1.

The gate electrode 31 and the drain electrode 32 formed on the surface of the FET chip 3 are abridged in FIGS. 10A and 10B for the sake of simplicity. Also, the wires connected between these electrodes and the capacitors or between these electrodes and the output lead 6 are not shown in FIGS. 10A and 10B.

The FET chip 3 is fixed on the metal base 1 by, for example, Au-Sn soldering.

The capacitors are comprised of a dielectric material of, for example, barium titanate ($BaTiO_3$) plate, both surfaces of which are covered by electrodes. Each of the electrodes are comprised of, for example, three layers of titanium (Ti) on the dielectric plate, palladium (Pd) on the titanium layer and gold (Au) on the palladium layer. One electrode formed on one surface of the dielectric plate is the grounding electrode common to the capacitors 40, 41, 42, and 43, and is attached to the metal base 1 by means of, for example, Au-Sn soldering. The other electrode formed on the other surface of the dielectric plate is, as previously mentioned, subject to, for example, an etching procedure for forming separated metal electrodes of the capacitors 40, 41, 42, and 43. Each of these electrodes itself constitutes a bonding pad. The portion of the dielectric plate under each separated electrode acts as a capacitor.

Figure 11:
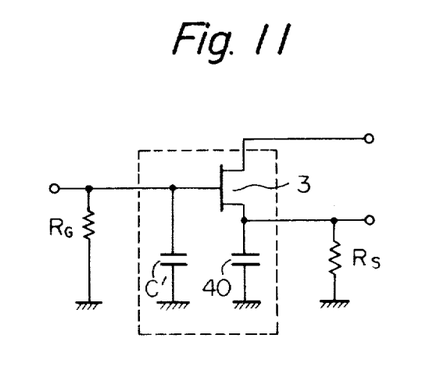
FIG. 11 is an equivalent circuit diagram of the device of FIG. 8.

FIG. 11 is an equivalent circuit diagram of the GaAs FET device of FIG. 8. The capacitance C' is equal to the total capacitance of the capacitors 41, 42, and 43 connected in parallel. In contrast with the prior-art circuit diagram of FIG. 5, the capacitor C' as well as the FET chip 3 and the capacitor 40 arranged within the base 1 are shown inside the dotted line. The resistors $R_S$ and $R_G$ for producing a self bias voltage are connected to the source lead 5a or 5b and the input lead 7, respectively, at points outside the base 1, and thus, are shown outside the dotted line.

Figure 12:
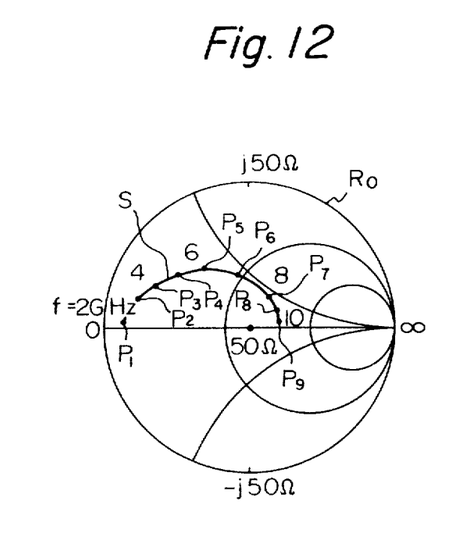
FIG. 12 is a Smith Chart illustrating a curve of an S-parameter $S_{11}$ of the GaAs FET of FIG. 8.

FIG. 12 is a Smith Chart illustrating a curve of the S-parameter S11 of the GaAs power FET illustrated in FIG. 8 when the gate width (i.e., the total length of the fingers of the gate electrode) is 10 mm. In this Smith Chart, the characteristic impedance of the input lead is the same as that represented in FIG. 6. The S-parameter in FIG. 12 also varies along the curve S from the point $P_1$ to the point $P_9$ when the input frequency changes from 2 GHz to 10 GHz. In contrast with the case of FIG. 6, it will be understood that the Q-value of the FET device of the present embodiment is lower than that of the prior-art device illustrated in FIG. 5. Moreover, the higher the input frequency becomes (8, 9, 10 GHz), the more closely the curve S approaches to the center of the Chart. Therefore, in the GaAs FET device of this embodiment, input impedance matching can be established very easily.

In this embodiment of FIG. 8, the capacitance of the capacitor 41, 42, or 43 for impedance matching is designed to be 2.6 pF and the capacitance of the grounding capacitor 40 is designed to be 15 pF. In this condition and at a frequency of 6.0 GHz through 7.4 GHz, the device of this embodiment can achieve a linear gain of 6.5 dB through 7 dB with an accuracy of ±0.5 dB and an output power of 33 dBm (2W) at 1-dB gain compression.

In the above described embodiment, although the metal base 1 includes only one FET chip, the metal base 1 may include more FET chips for increasing output power. In addition, the number and the position of the capacitors for input impedance matching are not restricted to those of the embodiment, but are determined in accordance with any desired circuit design. Further, in place of the GaAs FET chip, a bipolar transistor chip or a metal-insulator-semi-conductor (MIS) FET chip or an FET fabricated on a silicon or sapphire substrate may be used.

What is claimed is:

1. A semiconductor device, assembled on a base, comprising:
a semiconductor chip having an input electrode and an output electrode;
an input lead connected to said input electrode;
an output lead connected to said output electrode; and
capacitors mounted between said input lead and said semiconductor chip, said capacitors comprising at least one capacitor for grounding high-frequency components and at least one capacitor for input-impedance matching.

2. The semiconductor device of claim 1, wherein said semiconductor chip is self biased.

3. The device of claim 1, wherein said chip comprises a bipolar junction transistor.

4. The device of claim 1, wherein said chip further comprises a sapphire substrate.

5. The device of claim 1, wherein said chip further comprises a silicon substrate.

6. The device of claim 1, wherein said chip comprises a field effect transistor atop a sapphire substrate.

7. The device of claim 1, wherein said chip comprises a MISFET.

8. The device of claim 1, wherein said chip is attached to said base by means of gold-tin solder.

9. The device of claim 1, comprising three of said matching capacitors.

10. The device of claim 1, further comprising:
gold wires connecting said input leads to said input electrode; and
gold wires connecting said output leads to said output electrode.

11. The device of claim 1, further comprising:
gold ribbons connecting said input lead to said input electrode; and
gold ribbons connecting said output lead to said output electrode.

12. The device of claim 1, further comprising a plurality of said chips assembled on said base.

13. The semiconductor device of claim 1, wherein said semiconductor chip comprises a field effect transistor.

14. The semiconductor device of claim 13, wherein said input electrode and said output electrode of said semiconductor chip are a gate electrode and a drain electrode of said field effect transistor respectively.

15. The device of claim 14, wherein the shape of said chip is rectangular.

16. The device of claim 15, wherein said chip comprises interdigitated electrodes.

17. The device of claim 15, wherein the longer dimension of said chip is arranged perpendicular to said input lead and to said output lead.

18. The semiconductor device of claim 1, wherein said base comprises a grounded metal surface laterally interposed between an edge of said input lead and an edge of said output lead.

19. The device of claim 18, wherein said grounded metal surface comprises copper and a film of gold.

20. The semiconductor device of claim 18, wherein said semiconductor chip comprises a source electrode.

21. The semiconductor device of claim 20, wherein said capacitor for input impedance matching is operatively connected between said input electrode and said grounded metal surface of said base.

22. The semiconductor device of claim 20, wherein said capacitor for grounding high-frequency components is operatively connected between said source electrode and said grounded metal surface of said base.

23. The device of claim 22, wherein said chip comprises a gate width of approximately 10 mm.

24. The device of claim 23, wherein said grounding capacitor comprises a capacitor of approximately 15 picofarads.

25. The device of claim 24, wherein said matching capacitor comprises a capacitance of approximately 2.6 picofarads.

26. The device of claim 18, wherein each of said grounding capacitors and each of said matching capacitors comprises:
a layer of dielectric over said grounded metal surface; and
a second layer of metal atop said dielectric.

27. The device of claim 26, wherein said dielectric layer is common both to said matching capacitors and to said grounding capacitors, and said matching capacitors are separated from said grounding capacitors by channels etched out of said second metal layer.

28. The device of claim 26, wherein said dielectric comprises barium titanate.

29. The device of claim 26, wherein said second metal layer comprises:
one or more layers of titanium, atop said dielectric;
a layer of palladium atop said layer of titanum; and
a layer of gold atop said layer of palladium.

30. The semiconductor device of claim 1, wherein said semiconductor chip comprises interdigitated electrodes.

31. The semiconductor device of claim 30, wherein said semiconductor chip is a GaAs FET.

32. A semiconductor device comprising:
a GaAs FET chip of a self-biased type having a gate electrode, a drain electrode, and a source electrode, said gate electrode and said drain electrode having a plurality of fingers interdigitated to each other;
an input lead connected to said gate electrode;
an output lead connected to said drain electrode;
a grounded metal surface laterally interposed between said input lead and said output lead; and
capacitors mounted on said grounded metal surface and arranged between said input lead and said GaAs FET chip,
said capacitors comprising at least one capacitor for grounding high-frequency components and at least one capacitor for input-impedance matching, said capacitor for grounding high-frequency components being connected between said source electrode and said grounded metal surface, and said capacitor for input impedance matching being connected between said gate electrode and said grounded metal surface.

33. The semiconductor devide of claim 32, wherein said grounded metal surface comprises a base on which said semiconductor chip is assembled.

34. A process for manufacturing a semiconductor device, comprising the steps of:
providing, on a base, an input lead; an output lead; a power supply lead; a microwave device comprising input, output, and power supply electrodes; and a grounding capacitor;
etching said grounding capacitor, so as to form one or more matching capacitors which are electrically separated from the remainder of said grounding capacitor; and
connecting said grounding capacitor to said power supply electrode and to said power supply lead, connecting said matching capacitors to said input electrode and to said input lead, and connecting said output electrode to said output lead.

35. A circuit arrangement for a semiconductor device comprising:
an electrically conductive base having a surface acting as a grounding terminal;
an insulating plate arranged around the peripheray of said surface of said base;
a high-power field effect transistor on a semiconductor chip having a low-input impedance mounted on a part of said surface of said base and having a gate electrode, a drain electrode and a source electrode for conducting high-frequency current components;
an input lead partially mounted on a first side of said insulating plate so as to be insulated from said base and electrically connected through a first plurality of short wires to said gate electrode;
an output lead partially mounted on the other side opposite to said first side of said insulating plate so as to be insulated from said base and electrically connected through a second plurality of short wires to said drain electrode;
a dielectric, having on its surfaces at least first and second groups of electrically conductive plates which are electrically insulated from each other, mounted on said base and between said semiconductor chip and said input lead, the first group of said electrically conductive plates being electrically connected through said first plurality of short wires to said gate electrode of said semiconductor chip, and through said second plurality of short wires to said input lead, the second group of said electrically conductive plates being electrically connected through a third plurality of short wires to said source electrode of said high-power field effect semiconductor chip,
a first capacitor for input-impedance matching being formed between said first group of said electrically conductive plates and said base, and
a second capacitor for grounding said high-frequency components being formed between the second said group of said electrically conductive plates and said base.

36. The arrangement of claim 35, comprising source leads partially mounted on said insulating plate so as to be insulated from said base and to extend perpendicularly to the direction of said input lead and said output lead, said source leads being electrically connected through said third plurality of short wires to said electrically conductive plate on said dielectric.

* * * * *